US008139073B1

(12) United States Patent
Van Dyke et al.

(10) Patent No.: US 8,139,073 B1
(45) Date of Patent: *Mar. 20, 2012

(54) EARLY COMPRESSION TAG LOOKUP FOR MEMORY ACCESSES

(75) Inventors: James M. Van Dyke, Austin, TX (US); John H. Edmondson, Arlington, MA (US); Brian D. Hutsell, Fort Worth, TX (US); Michael F. Harris, Raleigh, NC (US)

(73) Assignee: NVIDIA Corporation, Santa Clara, CA (US)

( * ) Notice: Subject to any disclaimer, the term of this patent is extended or adjusted under 35 U.S.C. 154(b) by 895 days.

This patent is subject to a terminal disclaimer.

(21) Appl. No.: 11/532,854

(22) Filed: Sep. 18, 2006

(51) Int. Cl.
*G06F 13/18* (2006.01)

(52) U.S. Cl. ........ 345/535; 345/555; 345/556; 382/166; 382/232

(58) Field of Classification Search .................. 345/421, 345/422, 423, 501, 506, 535, 555, 556, 557, 345/563, 544; 382/166, 232, 239; 358/1.15; 711/118, 125
See application file for complete search history.

(56) References Cited

U.S. PATENT DOCUMENTS

| 5,936,616 | A  | * | 8/1999  | Torborg et al.   | 345/555 |
|-----------|----|---|---------|------------------|---------|
| 5,990,913 | A  | * | 11/1999 | Harriman et al.  | 345/531 |
| 6,999,088 | B1 | * | 2/2006  | Van Dyke et al.  | 345/544 |
| 7,050,063 | B1 | * | 5/2006  | Mantor et al.    | 345/582 |
| 7,420,568 | B1 | * | 9/2008  | Bittel et al.    | 345/544 |
| 7,680,992 | B1 | * | 3/2010  | Van Dyke et al.  | 711/155 |
| 2003/0030644 | A1 | * | 2/2003 | Wang et al.      | 345/532 |
| 2004/0091160 | A1 | * | 5/2004 | Hook et al.      | 382/239 |
| 2005/0243096 | A1 | * | 11/2005 | Possley et al.  | 345/520 |
| 2007/0130390 | A1 | * | 6/2007 | Hao              | 710/52  |

\* cited by examiner

*Primary Examiner* — Daniel Washburn
*Assistant Examiner* — Donna Ricks
(74) *Attorney, Agent, or Firm* — Patterson & Sheridan, LLP

(57) ABSTRACT

Systems and methods for determining a compression tag state prior to memory client arbitration may reduce the latency for memory accesses. A compression tag is associated with each portion of a surface stored in memory and indicates whether or not the data stored in each portion is compressed or not. A client uses the compression tags to construct memory access requests and the size of each request is based on whether or not the portion of the surface to be accessed is compressed or not. When multiple clients access the same surface the compression tag reads are interlocked with the pending memory access requests to ensure that the compression tags provided to each client are accurate. This mechanism allows for memory bandwidth optimizations including reordering memory access requests for efficient access.

20 Claims, 12 Drawing Sheets

EARLY COMPRESSION TAG LOOKUP FOR MEMORY ACCESSES

BACKGROUND OF THE INVENTION

1. Field of the Invention

Embodiments of the present invention generally relate to accessing memory that stores compressed and non-compressed data and, more specifically, to determining whether or not the data is compressed or non-compressed before memory accesses are arbitrated.

2. Description of the Related Art

Graphics data may be stored in a compressed format in order to reduce the memory bandwidth needed to access the graphics data. Some portions of the graphics data may be compressed and other portions of the graphics data may be non-compressed. Reading or writing the compressed graphics data requires less memory bandwidth than reading or writing the non-compressed graphics data. Therefore, a graphics surface may be stored as a combination of non-compressed and compressed graphics data and the state of each portion may be tracked. When multiple clients access the memory, the state of each portion is updated as the graphics data changed from compressed to non-compressed. Before specifying the size of a memory access request a client needs to accurately determine whether or not graphics data is being read from or written to a compressed portion of the memory. If a read request is constructed assuming that a particular portion of memory is compressed and the state of the particular portion changes from compressed to non-compressed before the read request is processed then non-compressed graphics data will be returned and incorrectly treated as compressed data.

Accordingly, it is desirable to accurately determine whether or not a portion of memory being accessed by a client is compressed or non-compressed prior to constructing a memory access request to read or write graphics data stored in the portion of memory.

SUMMARY OF THE INVENTION

Systems and methods for accurately determining whether or not a portion of memory accessed by a client request is compressed or non-compressed when multiple clients may access the portion of memory may be used to allow memory bandwidth optimizations. A compression tag state is read by a client prior to memory client arbitration so that the client can determine whether or not the portion of memory that will be accessed is compressed or non-compressed and construct a memory access read request specifying the amount of data to be read. Therefore, compression tag state reads are interlocked with pending memory access requests to ensure that the compression tags provided to each client are accurate. The amount of space allocated in a return data buffer to store read data is correct since the amount of data specified in memory access read requests is accurate. Data corruption is avoided since read data is correctly treated as compressed or non-compressed. Furthermore, memory access requests may be reordered to reduce dynamic random access memory (DRAM) row-bank activation and precharge cycles to improve memory bandwidth utilization The return data buffer ensures that memory access read requests are returned in the order that the requests were received on a client-by-client basis.

Various embodiments of a method of the invention for reading a surface stored in memory that includes compressed data and non-compressed data include producing a read request to obtain existing data stored in a tile mapped to the surface, reading a compression tag corresponding to a position of the tile from a compression tag cache, determining if the existing data stored in the tile is represented in a compressed format or in a non-compressed format based on the compression tag, outputting the read request for arbitration to access the memory in order to receive the existing data stored in the tile, and updating the compression tag stored in the compression tag cache when an entry in a compression tag storage corresponding to the position of the tile is changed.

Various embodiments of a method of the invention for writing a surface stored in memory that includes compressed data and non-compressed data include producing a write request to store new data in a tile mapped to the surface, reading a compression tag corresponding to a position of the tile from a compression tag cache, determining if existing data stored in the tile is represented in a compressed format or in a non-compressed format, determining if the new data is compressible, and outputting the write request for arbitration to access the memory in order to store the new data in the tile.

Various embodiments of the invention include a system for accessing a surface stored in memory that includes data represented in a compressed format and data represented in a non-compressed format. The system includes a compression aware client, an arbitration unit, a compression tag storage, and a compression tag cache. The compression aware client is configured to produce the data represented in the compressed format or the data represented in the non-compressed format for storage in tiles mapped to the surface and to produce read and write requests to access the surface. The arbitration unit is configured to arbitrate between the read and write requests produced by the compression aware client and read and write requests produced by other clients. The compression tag storage is coupled to the arbitration unit and is configured to store a compression tag indicating whether each one of the tiles mapped to the surface stores the data represented in the compressed format or the data represented in the non-compressed format. The compression tag cache is coupled between the compression aware client and the compression tag storage and is configured to process compression tag writes received from the arbitration unit and process compression tag reads received from the compression aware client.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following description, numerous specific details are set forth to provide a more thorough understanding of the present invention. However, it will be apparent to one of skill in the art that the present invention may be practiced without one or more of these specific details. In other instances, well-known features have not been described in order to avoid obscuring the present invention.

Figure 1:
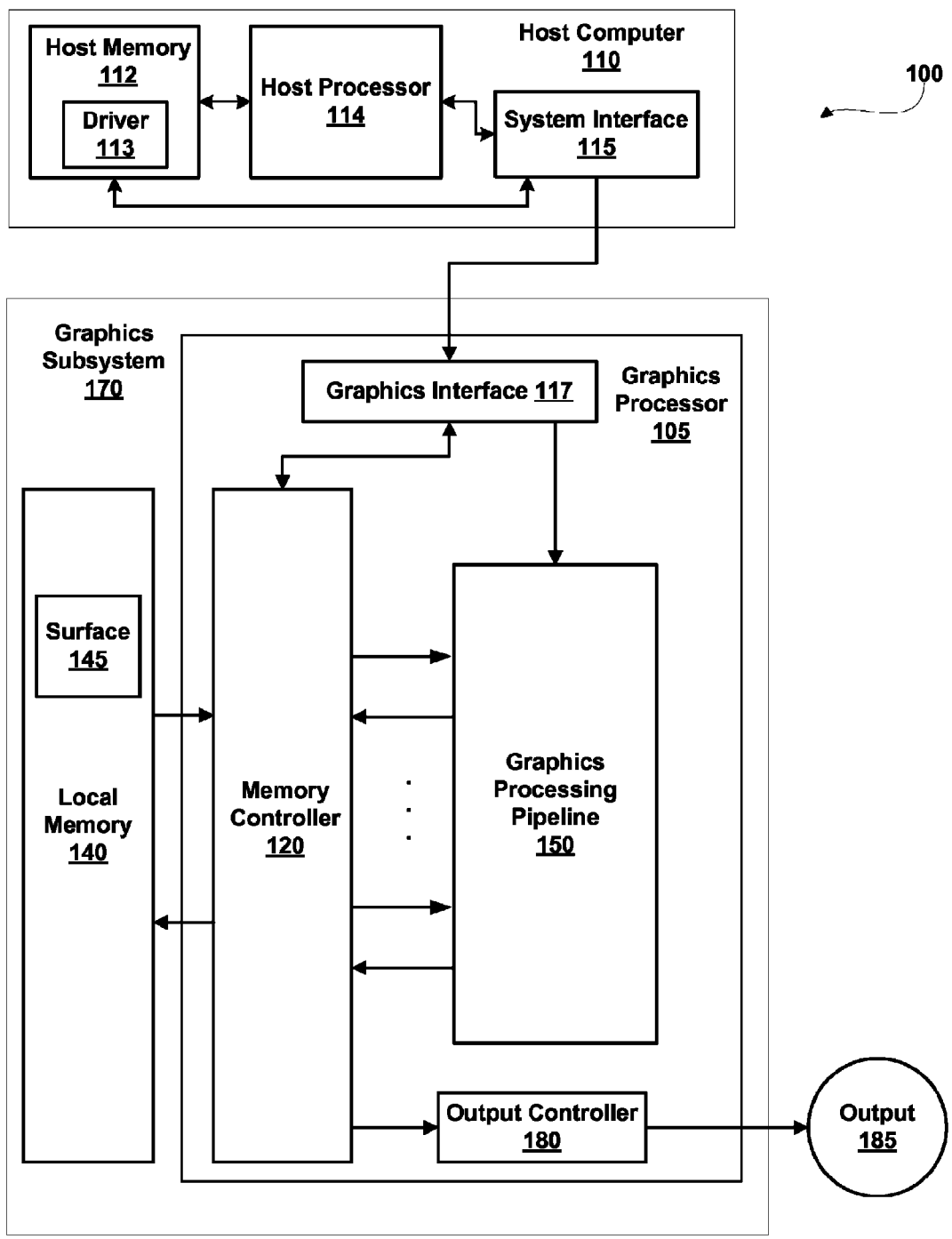
FIG. 1 illustrates a computing system including a host computer and a graphics subsystem in accordance with one or more aspects of the present invention.

FIG. 1 illustrates a computing system generally designated 100 including a host computer 110 and a graphics subsystem 170 in accordance with one or more aspects of the present invention. Computing system 100 may be a desktop computer, server, laptop computer, personal digital assistant (PDA), palm-sized computer, tablet computer, game console, cellular telephone, computer based simulator, or the like. Host computer 110 includes host processor 114 that may include a system memory controller to interface directly to host memory 112 or may communicate with host memory 112 through a system interface 115. System interface 115 may be an I/O (input/output) interface or a bridge device including the system memory controller to interface directly to host memory 112.

A graphics device driver, driver 113, interfaces between processes executed by host processor 114, such as application programs, and a programmable graphics processor 105, translating program instructions as needed for execution by graphics processor 105. Driver 113 also uses commands to configure sub-units within graphics processor 105. Specifically, driver 113 allocates portions of local memory that are used to store graphics surfaces including image data and texture maps, such as surface 145.

Host computer 110 communicates with graphics subsystem 170 via system interface 115 and a graphics interface 117 within a graphics processor 105. Data received at graphics interface 117 can be passed to a multi-threaded processing array 150 or written to a local memory 140 through memory controller 120. Graphics processor 105 uses graphics memory to store graphics data and program instructions, where graphics data is any data that is input to or output from components within the graphics processor. Graphics memory can include portions of host memory 112, local memory 140, register files coupled to the components within graphics processor 105, and the like.

In a typical implementation, graphics processing pipeline 150 performs geometry computations, rasterization, and pixel computations. Therefore, graphics processing pipeline 150 is programmed to operate on surface, primitive, vertex, fragment, pixel, sample or any other data. When the data received by graphics subsystem 170 has been completely processed by graphics processor 105, an output 185 of graphics subsystem 170 is provided using an output controller 180. Output controller 180 is optionally configured to deliver data to a display device, network, electronic control system, other computing system 100, other graphics subsystem 170, or the like. Alternatively, data is output to a film recording device or written to a peripheral device, e.g., disk drive, tape, compact disk, or the like.

Graphics processor 105 receives commands from host computer 110 via graphics interface 117. Some of the commands are used by graphics processing pipeline 150 to initiate processing of data by providing the location of program instructions or graphics data stored in memory. Graphics processing pipeline 150 includes two or more programmable processing units that may be configured to perform a variety of specialized functions. Some of these functions are table lookup, scalar and vector addition, multiplication, division, coordinate-system mapping, calculation of vector normals, tessellation, calculation of derivatives, interpolation, and the like. In particular, a programmable processing unit may be configured to perform raster operations, including near and far plane clipping and raster operations, such as stencil, z test, and the like. Data processing operations are performed in multiple passes through those units or in multiple passes within graphics processing pipeline 150. During the processing, data may be stored in graphics memory and read at a later time for further processing.

Graphics processing pipeline 150 includes interfaces to memory controller 120 through which data can be read from memory and written to memory, e.g., any combination of local memory 140 and host memory 112. In some embodiments of the present invention, graphics processing pipeline 150 is a multithreaded processing array. Memory controller 120 arbitrates requests received from various clients within graphics processing pipeline 150 that correspond to the interfaces, e.g., programmable processing units, to distribute the memory bandwidth between the various clients.

Figures 2A, 2B:
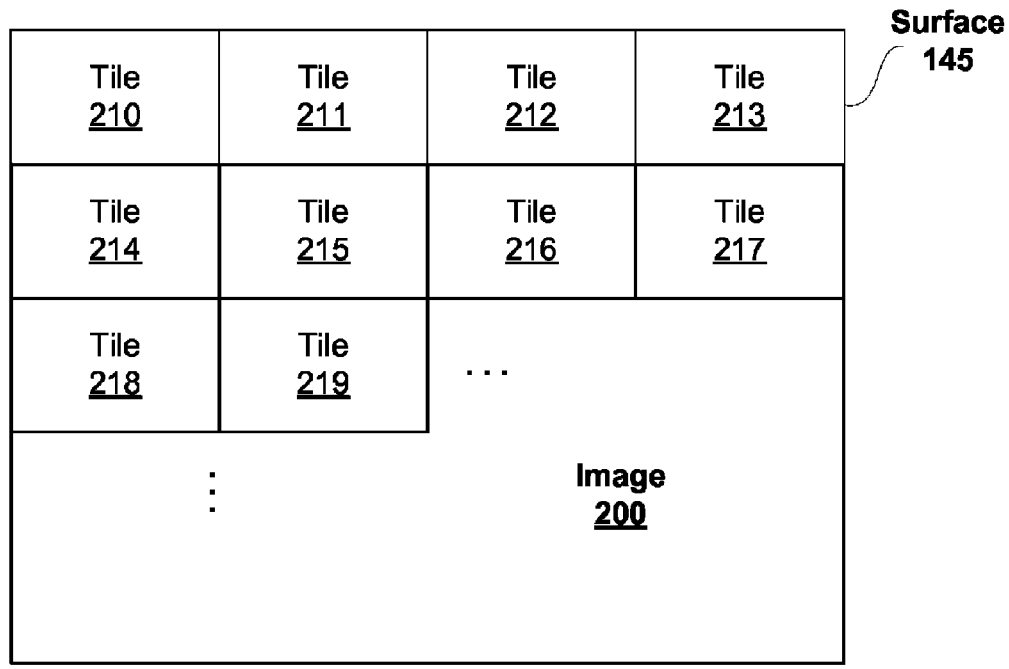
FIG. 2A illustrates a conceptual diagram of a mapping of tiles to a two-dimensional image in accordance with one or more aspects of the present invention.
FIG. 2B illustrates a conceptual diagram of a tile of compressed data in accordance with one or more aspects of the present invention.

Surface 145 includes several entries for storing graphics data representing surface 145. Surface 145 is organized as tiles that are mapped to two-dimensional image. FIG. 2A illustrates a conceptual diagram of a mapping of tiles 210, 211, 212, 213, 214, 215, 216, 217, 218, and 219 to a two-dimensional image 200, in accordance with one or more aspects of the present invention. Each tile 210, 211, 212, 213, 214, 215, 216, 217, 218, and 219 may store graphics data that is compressed or non-compressed. A compression tag is associated with each tile and indicates whether or not the graphics data stored in the tile is compressed or not. The compression tags are stored and maintained within memory controller 120.

FIG. 2B illustrates a conceptual diagram of tile 210 storing compressed data entries 220, in accordance with one or more aspects of the present invention. When the graphics data is compressed only a portion of the entries within a tile need to be read or written to access graphics data for all of the samples of image 200 represented by the tile. For example, when 8:1 compression is used for the graphics data stored in tile 210, compressed data entries 220 stores compressed graphics data representing the entire tile 210. The seven unused entries 230 do not need to be read or written to process the graphics data representing tile 210 unless the compression ratio is decreased or the graphics data is represented in a non-compressed form. The entries within a tile storing the compressed data, such as compressed data entries 220 are referred to as a "compression tile." In some embodiments of the present invention, a compression tile is 128 bytes or 256 bytes.

Because the number of tile entries that need to be accessed to process a memory read or write request varies depending on whether or not the tile is compressed, a client initiating the request should determine the compression tag state prior to arbitration. Accurately specifying the amount of data that will be returned for a read request allows for the correct amount of memory to be allocated to buffer the return data and for the number of requests to output to the DRAM to be determined.

A client may want to write data that does not cover an entire tile (a partial write) in which case the compression tag for the tile needs to be read to determine if the client needs to read the compressed tile to decompress and combine the write data with the existing tile data. In some embodiments of the present invention, a client is configured to perform a read-modify-write operation in order to complete the partial write request. Since the compression state signals may be coupled to the memory interface used to read the tile data, reading the compression state consumes a cycle on the memory interface. Similarly, if the compression state is stored along with the tile data, reading the compression state consumes a cycle on the memory interface. If the tile is uncompressed, no read was required and the memory interface cycle was unnecessary. The present invention includes a compression tag cache that stores the compression state for a number of tiles within the client. The client can access the compression state for a tile without consuming a cycle on the memory interface for each access, advantageously avoiding unnecessary memory accesses.

Memory read requests may be reordered to optimize memory bandwidth utilization by grouping read requests and write requests separately. Requests may also be reordered to reduce precharge and activation latencies. Read data returned from memory is reordered back to the original request order before the data is provided to the requesting client. Since it is possible to store more read data that is compressed than read data that is non-compressed fewer entries are allocated to buffer compressed return data than non-compressed return read data. Therefore, if a number of entries sufficient to store a compression tile is allocated to store return read data for a client, and the tile state changes to non-compressed before the read is completed, then the read data will not be sufficient. Specifically, only a portion of the non-compressed tile will be available to the client since the number of entries allocated in the buffer cannot be changed due to the reordering capability of the buffer. Buffer allocations are performed in order and return read data is stored in order within the buffer, even when the requests presented to the DRAM have been reordered for performance optimizations. The present invention prevents data corruption of return read data while allowing for performance optimizations, such as reordering.

Figure 3:
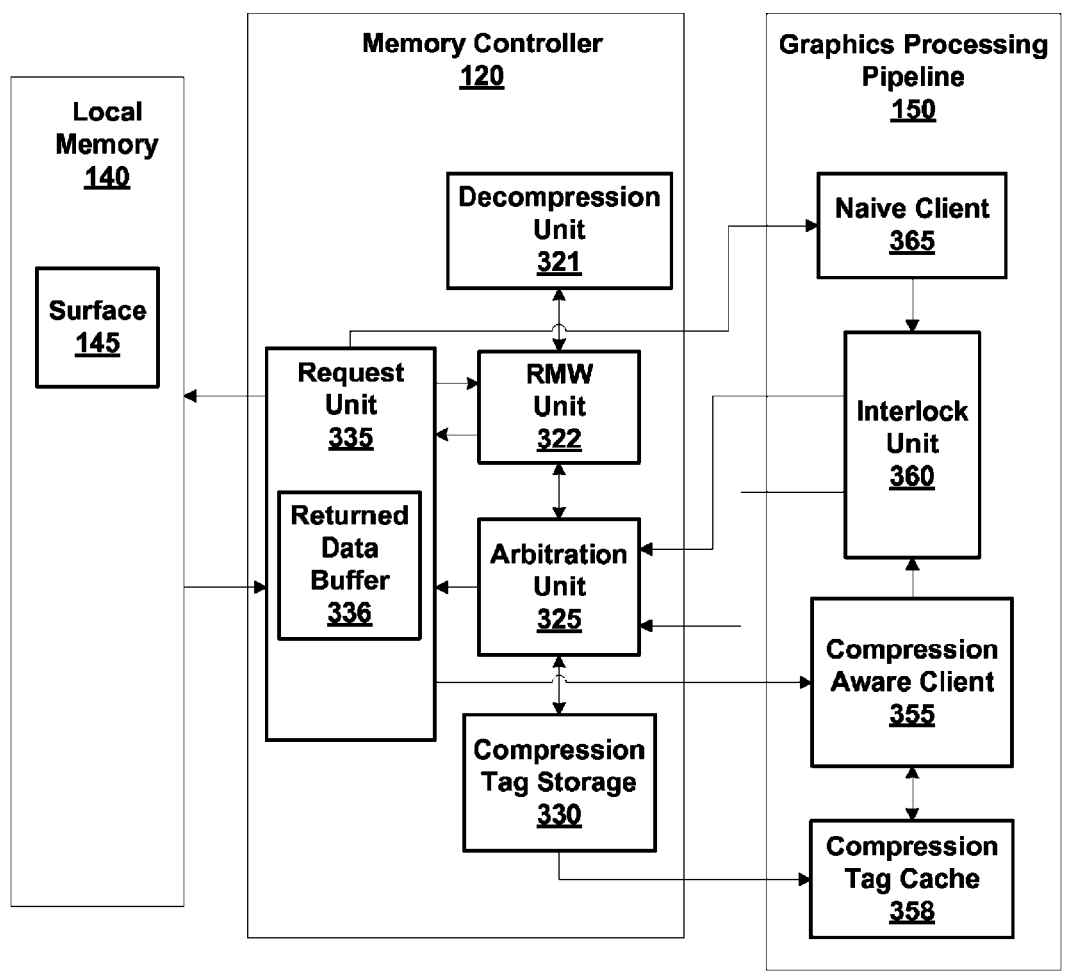
FIG. 3 illustrates the memory controller and graphics processing pipeline of FIG. 1 in accordance with one or more aspects of the present invention.

FIG. 3 illustrates memory controller 120 and graphics processing pipeline 150 of FIG. 1, in accordance with one or more aspects of the present invention. Graphics processing pipeline 150 may include several clients some of which are "compression aware" and others that are "naïve." Compression aware clients, such as compression aware client 355, are defined herein as a processing unit that is able to read and write compressed surfaces directly, as described in conjunction with FIGS. 4A, 4B, 4C, and 8A. Naïve clients are defined herein as a processing unit that is only able to read and write non-compressed surfaces. Therefore, memory controller 120 decompresses compressed data read by naïve client 365 and returns non-compressed data to naïve client 365. When naïve client 365 writes a tile, the tile is stored in a non-compressed format and memory controller 120 reads and decompresses the tile when only a portion of the tile is written by naïve client 365 and the tile is compressed, as described in conjunction with FIGS. 5A and 5B. Although a single naïve client 365 and a single compression aware client 355 are shown within graphics processing pipeline 150, additional naïve clients 365 and/or compression aware clients 355 may be included in graphics processing pipeline 150 and coupled to interlock unit 360.

Memory controller 120 includes a compression tag storage 330 that stores the compression state for each tile within a surface. In some embodiments a flag is asserted for a tile that is compressed and the flag is negated for a tile that is non-compressed. Additional bits may be stored in compression tag storage 330 to specify a particular compression format for each tile. Each compression format may also have a specific compression ratio, such that the size of a compression tile varies as the compression format for a tile varies. An arbitration unit 325 maintains the compression tags stored in compression tag storage 330 based on write requests received from the clients, naïve client 365 and compression aware client 355.

Each compression aware client 355 is coupled to a dedicated compression tag cache 358 that is updated by compression tag storage 330, using techniques known to those skilled in the art. For example, a compression tag entry in compression tag cache 358 is invalidated when the corresponding entry in compression tag storage 330 is changed. When a requested entry in compression tag cache 358 is invalid or the entry is not stored in compression tag cache 358, it is fetched from compression tag storage 330. In addition to fetching the invalid entry, neighboring entries may also be fetched so that subsequent reads of compression tag cache 358 will be hits, i.e., other invalid entries will be updated. Compression aware client 355 accesses compression tag cache 358 to determine whether or not a read or write request accesses a compressed or non-compressed tile. Because naïve client 365 assumes that all tiles are uncompressed, naïve client 365 does not access the compression tag information. In an alternate embodiment of the present invention, compression tag cache 358 is omitted and compression aware client 355 accesses compression tag storage 330 directly.

Clients may group requests for memory bandwidth efficiency. For example, reads requests may be grouped separately from write requests to reduce timing delays incurred for bus turnaround. Requests may also be grouped to minimize bank conflicts and allow for precharge delays to switch banks to be hidden during accesses to a single bank of memory. Grouping of requests by a client is performed prior to allocation of entries in returned data buffer 336 for return read data. As previously described, requests may also be reordered by request unit 335 after the allocation of entries in returned data buffer 336. Requests for different clients or for a single client may be reordered by request unit 335 to improve memory bandwidth utilization.

Naïve client 365 and compression aware client 355 present read and write requests to interlock unit 360. Interlock unit 360 ensures that a compression tag read from compression tag cache 358 by compression aware client 355 is accurate. Interlock unit 360 holds off requests from naïve client 365 and compression aware client 355 as needed when requests that may change the compression tag for a particular tile are output by arbitration unit 325, as described in conjunction with FIGS. 6, 7A, and 7B.

Arbitration unit 325 receives requests from naïve client 365 and compression aware client 355 via interlock unit 360. Arbitration unit 325 uses techniques known to those skilled in the art to arbitrate the requests based on a fixed or programmable priority scheme. When a read request is received from naïve client 365 arbitration unit 325 outputs the request information, e.g., request size and compression format, for compressed tiles to RMW (read-modify-write) unit 322. RMW unit 322 uses the request information to decompress read tile data returned via request unit 335 for the tile. Specifically, RMW unit 322 provides the compressed tile to decompression unit 321 and receives the decompressed tile for output to naïve client 365 via request unit 335. Non-compressed read tile data is returned to naïve client 365 directly by request unit 335.

Request unit 335 outputs read and write requests received from arbitration unit 325 to local memory 140. Request unit 335 also includes a returned data buffer 336 to store data read from local memory 140 and uncompressed data produced by decompression unit 321 for output to naïve client 365. Entries in returned data buffer 336 are allocated by arbitration unit 325 in the order in which they are received from each client. Request unit 335 may reorder requests into a different order than the original request order. However, read data is returned to each client in the same order as it was requested. Reordering requests may improve memory bandwidth utilization by minimizing bus turnaround delays and avoiding bank conflicts.

When a write request is received from naïve client 365 that does not write an entire tile, i.e., a partial write, arbitration unit 325 generates and outputs a read request for the tile to request unit 335 to obtain the tile data. Arbitration unit 325 also outputs the request information, e.g., request size and compression format, for compressed tiles to RMW unit 322. RMW unit 322 uses the request information to decompress read tile data returned via request unit 335 for the tile. Uncompressed read tile data is returned to RMW unit 322 by decompression unit 321. RMW unit 322 merges the uncompressed read tile data with the write data provided by naïve client 365. Arbitration unit 325 then outputs the write request with the merged write data to request unit 335. If the compression tag for the tile changed from compressed to non-compressed, arbitration unit 325 also updates the compression tag stored in compression tag storage 330 and compression tag cache 358 if necessary. In some embodiments of the present invention, memory controller 120 includes a compression unit and when the merged write data is compressible it is compressed and the compression tag for the tile is not updated by arbitration unit 325.

Figure 4A:
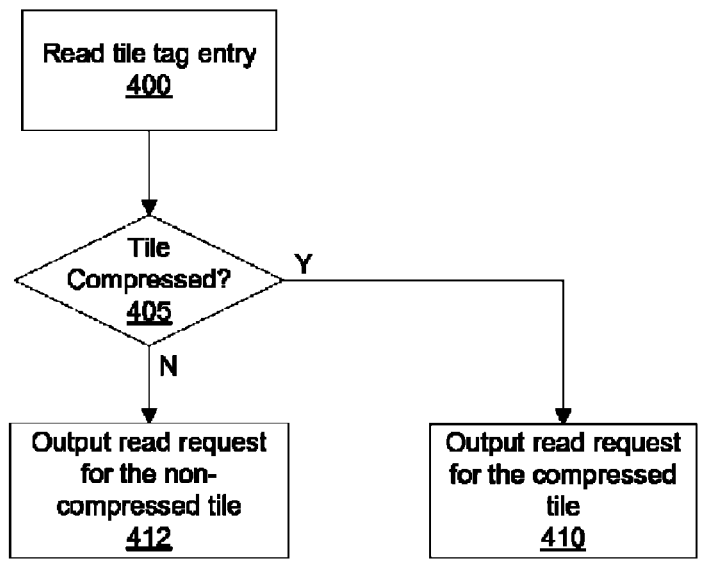
FIG. 4A illustrates a flow diagram of an exemplary method of determining a tile compression tag for a read request in accordance with one or more aspects of the present invention.

FIG. 4A illustrates a flow diagram of an exemplary method of determining a tile compression tag for a read request produced by compression aware client 355, in accordance with one or more aspects of the present invention. In step 400 compression aware client 355 reads the compression tag entry from compression tag cache 358 that corresponds to the tile to be read. The tile may be specified using a portion of the x,y coordinates corresponding to the tile position in image space or by using the row and bank portion of a DRAM (dynamic random access memory) address for the tile. In other embodiments of the present invention, each tile may be assigned a unique identifier.

In step 405 compression aware client 355 determines if the compression tag for the tile indicates that the tile is compressed, and, if so, in step 410 compression aware client 355 outputs the read request for the compressed tile specifying that the compression tile should be read rather than the entire tile. If, in step 405 compression aware client 355 determines that the compression tag for the tile indicates that the tile is non-compressed, then in step 412 compression aware client 355 outputs the read request for the non-compressed tile specifying the tile entries that should be read. The read request may include the tile position, the tile compression tag, and a read mask indicating the entries in the tile that should be read.

Figure 4B:
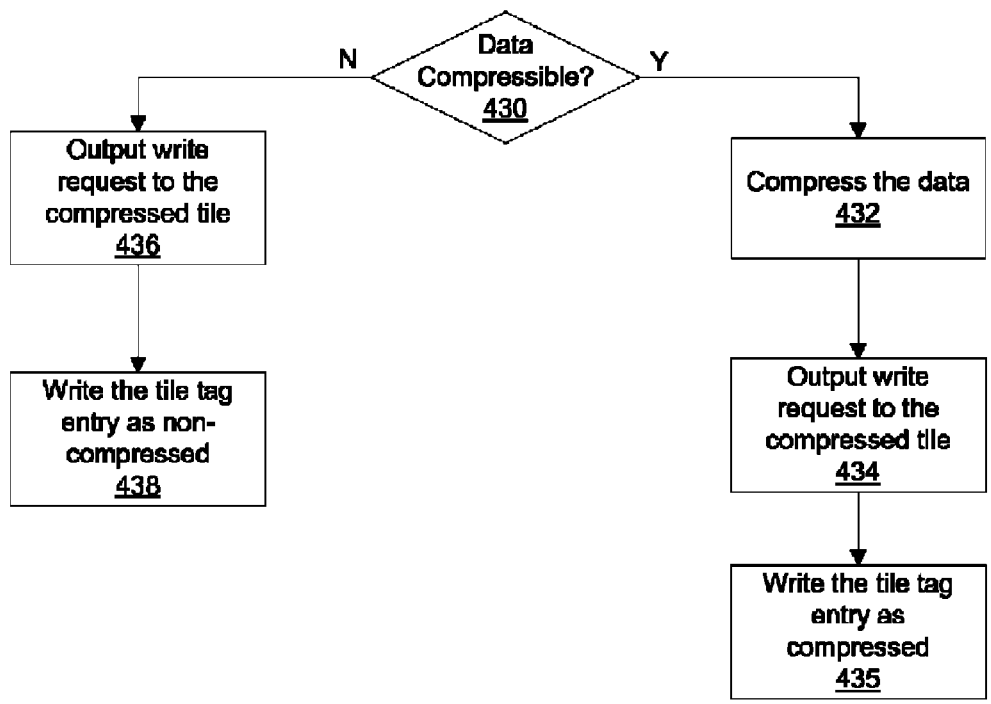
FIG. 4B illustrates a flow diagram of an exemplary method of determining a tile compression tag for a complete tile write request in accordance with one or more aspects of the present invention.

FIG. 4B illustrates a flow diagram of an exemplary method of determining a tile compression tag for a complete tile write request produced by compression aware client 355, in accordance with one or more aspects of the present invention. When a complete tile is written the tile data may be overwritten with the new tile data provided by compression aware client 355 since none of the existing tile data will be retained. Therefore, compression aware client 355 does not need to read a compression tag to determine the existing tile state.

In step 430 compression aware client 355 determines if the new tile data is compressible, and, if so in step 432 compression aware client 355 compresses the new tile data to produce compressed new tile data. In step 434 compression aware client 355 outputs the write request including the compressed new data for the tile to the compressed tile. The write request may include the tile position, the tile compression tag, the write data, and a write mask indicating the entries in the tile that should be written. In step 435 compression aware client 355 outputs an update for arbitration unit 325 to write the compression tag state stored in compression tag storage 330 for the tile as compressed. Once the compression tag state is written in compression tag storage 330, the corresponding tag state in compression tag cache 358 is updated.

If, in step 430 compression aware client 355 determines that the new tile data is not compressible, then in step 436 compression aware client 355 outputs the write request including the non-compressed new data for the tile to the compressed tile. In step 438 compression aware client 355 outputs an update for arbitration unit 325 to write the compression tag state stored in compression tag storage 330 for the tile as non-compressed. Once the compression tag state is written in compression tag storage 330, the corresponding tag state in compression tag cache 358 is updated. In the case of a write request for compression aware client 355, the amount of write data is determined prior to arbitration and since data will not be returned, entries are not allocated in returned data buffer 336.

Figure 4C:
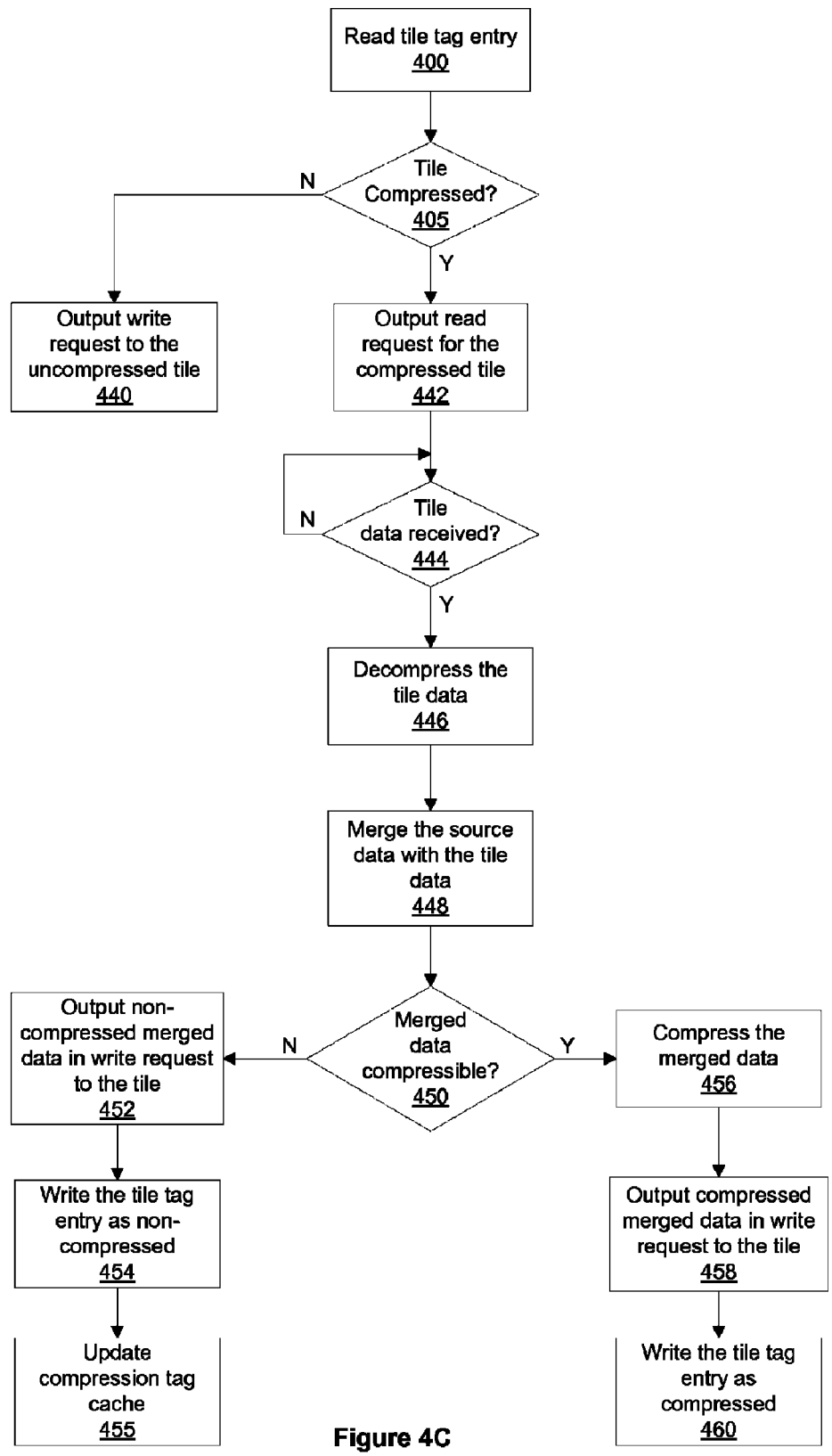
FIG. 4C illustrates a flow diagram of an exemplary method of determining a tile compression tag for a partial tile write request in accordance with one or more aspects of the present invention.

FIG. 4C illustrates a flow diagram of an exemplary method of determining a tile compression tag for a partial tile write request produced by compression aware client 355, in accordance with one or more aspects of the present invention. When a partial tile is written only a portion of the tile data is overwritten with the new tile data. Therefore, the new tile data is merged with the existing tile data and the merged tile data may or may not be compressible. Steps 400 and 405 are completed as previously described in conjunction with FIG. 4A.

If, in step 405 compression aware client 355 determines that the compression tag for the tile indicates that the tile is not compressed, then in step 440 compression aware client 355 outputs the write request for the non-compressed tile including the new tile data to be written. In some embodiments of the present invention, the new tile data may be merged with existing tile data and compressed if the merged tile data is compressible. In those embodiments of the present invention, read requests are generated by compression aware client 355 to perform the merge, as described in conjunction with FIG. 4D.

If, in step 405 compression aware client 355 determines that the compression tag for the tile indicates that the tile is compressed, then in step 442 compression aware client 355 produces and outputs a read request for the tile to obtain the existing tile data. In step 444 compression aware client 355 waits for the existing compressed tile data to be returned from request unit 335. Compression aware client 355 breaks the read-modify-write operation into separate transactions, e.g., a read transaction and a write transaction. Therefore, other clients may access memory between the separate transactions, improving memory bandwidth utilization compared with performing the read-modify-write operation as an atomic transaction.

When the existing compressed tile data is returned, compression aware client 355 proceeds to step 446 and decompresses the existing compressed tile data to produce the existing tile data. In step 448 compression aware client 355 merges the existing tile data with the new tile data to produce merged tile data.

If, in step 450 compression aware client 355 determines that the merged tile data is compressible, then in step 456 compression aware client 355 compresses the merged tile data to produce compressed merged tile data. In step 458 compression aware client 355 outputs the write request including the compressed merged data for the tile to the compressed tile. In step 460 compression aware client 355 outputs an update for arbitration unit 325 to write the compression tag state stored in compression tag storage 330 for the tile as compressed. Once the compression tag state is written in compression tag storage 330, the corresponding tag state in compression tag cache 358 is updated.

If, in step 450 compression aware client 355 determines that the merged tile data is not compressible, then in step 452 compression aware client 355 outputs the write request including the non-compressed merged data for the tile to the compressed tile. In step 454 compression aware client 355 outputs an update for arbitration unit 325 to write the compression tag state stored in compression tag storage 330 for the tile to non-compressed. Once the compression tag state is changed in compression tag storage 330, the corresponding tag state in compression tag cache 358 is updated in step 455.

Figure 4D:
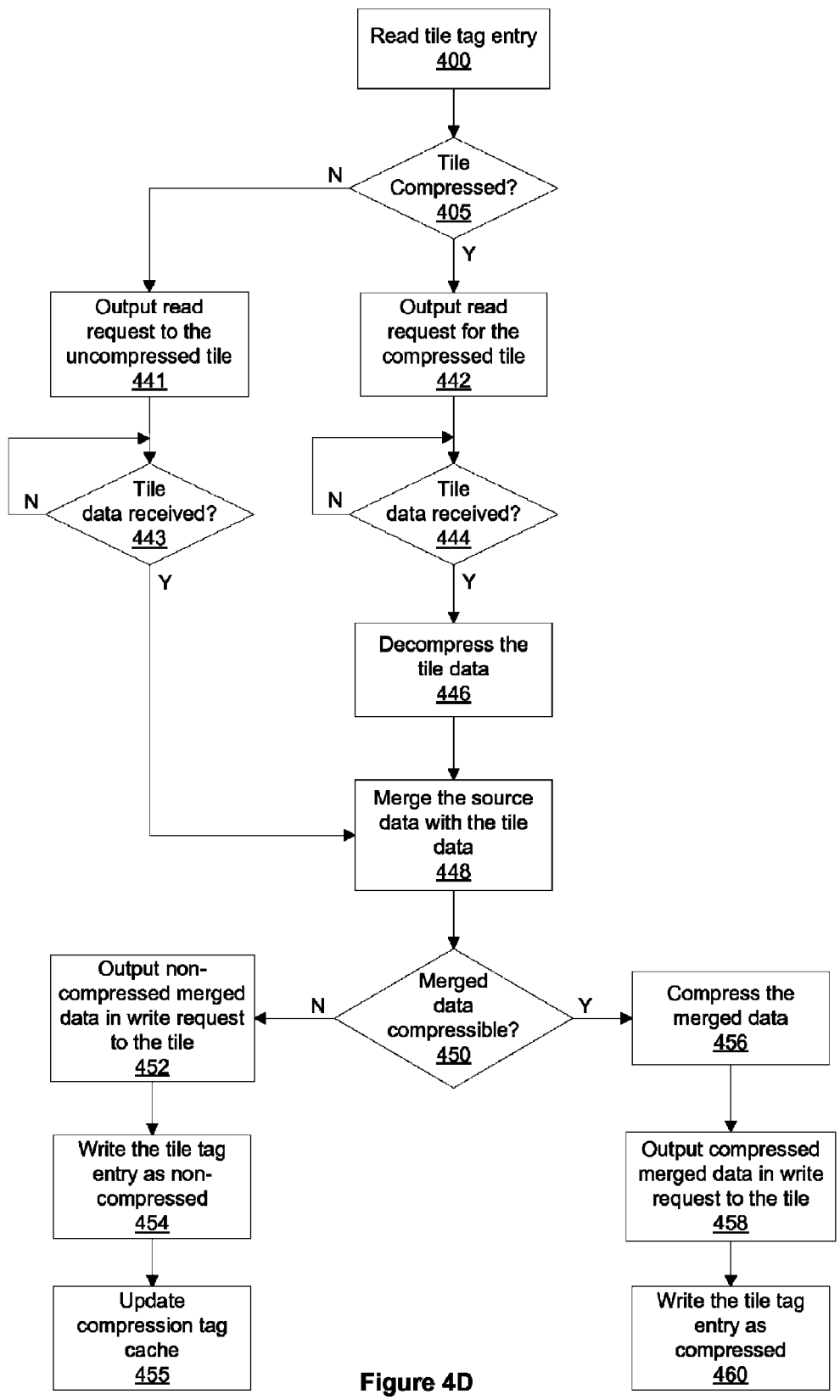
FIG. 4D illustrates a flow diagram of another exemplary method of determining a tile compression tag for a partial tile write request in accordance with one or more aspects of the present invention.

FIG. 4D illustrates a flow diagram of another exemplary method of determining a tile compression tag for a partial tile write request, in accordance with one or more aspects of the present invention. Steps 400, 405, 442, 444, 446, and 448 are completed as previously described in conjunction with FIG. 4C. If, in step 405 compression aware client 355 determines that the compression tag for the tile indicates that the tile is not compressed, then in step 441 compression aware client 355 produces and outputs a read request for the tile to obtain the existing tile data. In step 443 compression aware client 355 waits for the existing non-compressed tile data to be returned from request unit 335 before proceeding to step 448. Steps 448, 450, 452, 454, 455, 456, 458, and 460 are completed as previously described in conjunction with FIG. 4C. Using this method allows for partial writes to produce a tile in compressed format, even if the existing tile data is non-compressed.

In the case of a partial tile write request for compression aware client 355, the write may be broken down into two transactions, a read of the entire compressed or non-compressed tile followed by a write of merged tile data, i.e., combination of the decompressed or non-compressed tile and the write data. The amount of read data is determined by compression aware client 355 prior to arbitration. The amount of read tile data that will be returned to request unit 335 is also known, so the necessary storage resources may be reserved in returned data buffer 335 to receive the read tile data. Interlock unit 360 does not accept conflicting requests from other units until the read operation is complete in order to prevent read data corruption.

Figure 5A:
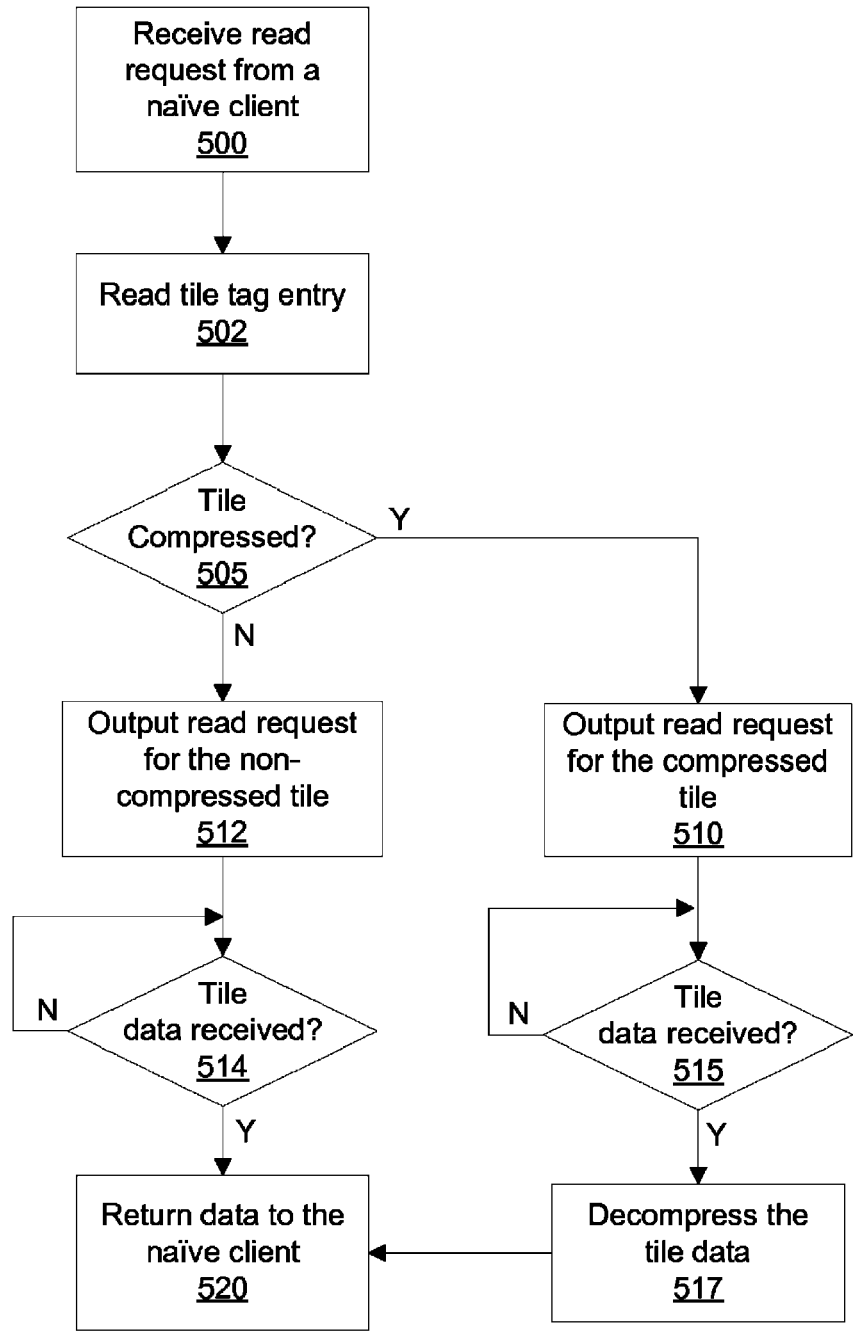
FIG. 5A illustrates a flow diagram of an exemplary method of performing a read request for a naïve client in accordance with one or more aspects of the present invention.

FIG. 5A illustrates a flow diagram of an exemplary method of performing a read request produced by naïve client 365, in accordance with one or more aspects of the present invention. Because naïve client 365 is only configured to process non-compressed data, decompression and compression is handled by memory controller 120 without involving naïve client 365. In step 500 arbitration unit 325 receives a read request produced by naïve client 365. In step 502 arbitration unit 325 reads the compression tag entry from compression tag storage 330 that corresponds to the tile to be read.

In step 505 arbitration unit 325 determines if the compression tag for the tile indicates that the tile is compressed, and, if so, in step 510 arbitration unit 325 outputs the read request for the compressed tile and provides the read request information, e.g., request size and compression format, to RMW unit 322. In step 515 RMW unit 322 waits for the existing compressed tile data to be returned from request unit 335. In step 517 RMW unit 322 receives the read tile data and provides the read tile data to decompression unit 321 to produce decompressed tile data. In step 520 RMW unit 322 provides the decompressed tile data to naïve client 365 via request unit 335.

If, in step 505 arbitration unit 325 determines that the compression tag for the tile indicates that the tile is not compressed, then in step 512 arbitration unit 325 outputs the read request for the non-compressed tile and provides the read request information to RMW unit 322. In step 514 RMW unit 322 waits for the existing compressed tile data to be returned from request unit 335. In step 520 RMW unit 322 provides the uncompressed tile data to naïve client 365 via request unit 335.

Figure 5B:
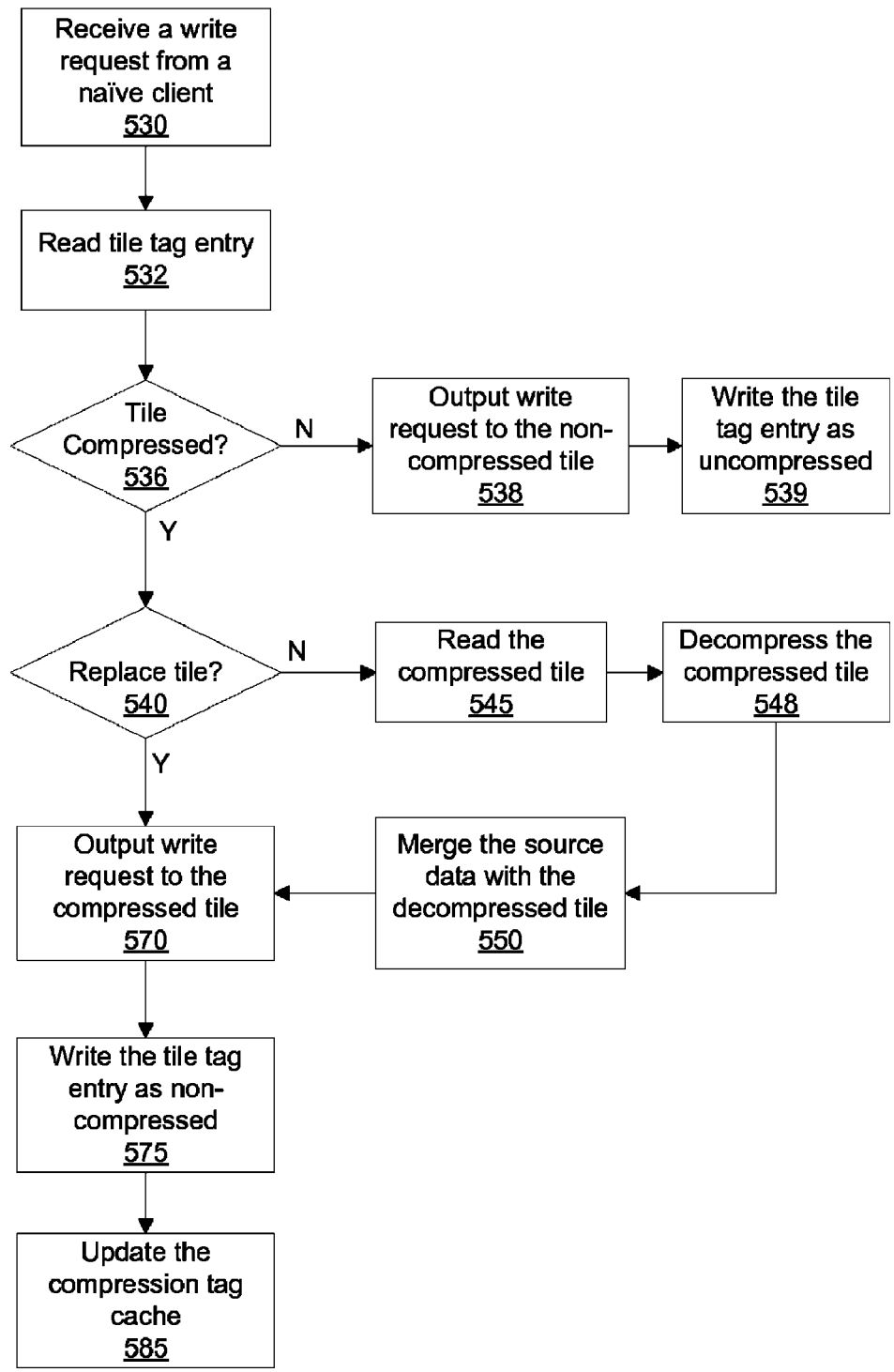
FIG. 5B illustrates a flow diagram of an exemplary method of performing a write request for a naïve client in accordance with one or more aspects of the present invention.

FIG. 5B illustrates a flow diagram of an exemplary method of performing a write request produced by naïve client 365, in accordance with one or more aspects of the present invention. Because naïve client 365 is only configured to process non-compressed data, partial tile writes to compressed tiles are broken down into a read and a write by memory controller 120 without involving naïve client 365. In step 530 arbitration unit 325 receives a write request produced by naïve client 365. All write requests received from naïve clients are non-compressed data, so arbitration unit 325 can easily determine the amount of data to be written. A partial tile write to a compressed tile requires writing the entire tile since the decompressed tile data will be merged with the write data provided by naïve client 365 with the write request. Alternately, the decompressed tile data may be written first, followed by the partial tile write. However, when compression aware client 355 requests read data and entries are allocated in returned data buffer 336, interlock unit 360 controls the read and write requests to prevent a compressed tile from changing state before read data is returned.

In step 532 arbitration unit 325 reads the compression tag entry from compression tag storage 330 that corresponds to the tile to be written. In step 536 arbitration unit 325 determines if the compression tag for the tile indicates that the tile is compressed, and, if not, in step 538 arbitration unit 325 outputs the write request for the non-compressed tile to request unit 335. In step 539 RMW unit 322 outputs an update for arbitration unit 325 to write the compression tag state stored in compression tag storage 330 for the tile as uncompressed. Once the compression tag state is written in compression tag storage 330, the corresponding tag state in compression tag cache 358 is updated.

In step 540 arbitration unit 325 determines if the entire existing tile will be replaced by the write operation, and, if not, in step 545 arbitration unit 325 outputs the read request for the existing compressed tile and outputs the request information to RMW unit 322. In step 548 RMW unit 322 receives the existing compressed tile data from request unit 335 and decompresses the tile to produce decompressed tile data. In step 550 RMW unit 322 merges the decompressed (existing) tile data with the new tile data, and proceeds to step 570. If, in step 540 arbitration unit 325 determines that the entire existing tile will be replaced by the write operation, then arbitration unit 325 proceeds directly to step 570.

In some embodiments of the present invention all write requests received from naïve client 365 cause the tile that is being written to be non-compressed and the amount of data to be written is easily determined. In other embodiments of the present invention, memory controller 120 is configured to compress tiles that are compressible. In step 570 arbitration unit 325 outputs the write request including the merged tile data to request unit 335. In step 575 arbitration unit 325 updates the compression tag state stored in compression tag storage 330 for the tile to non-compressed. In step 585 arbitration unit 325 updates the corresponding tag state in compression tag cache 358.

Figure 5C:
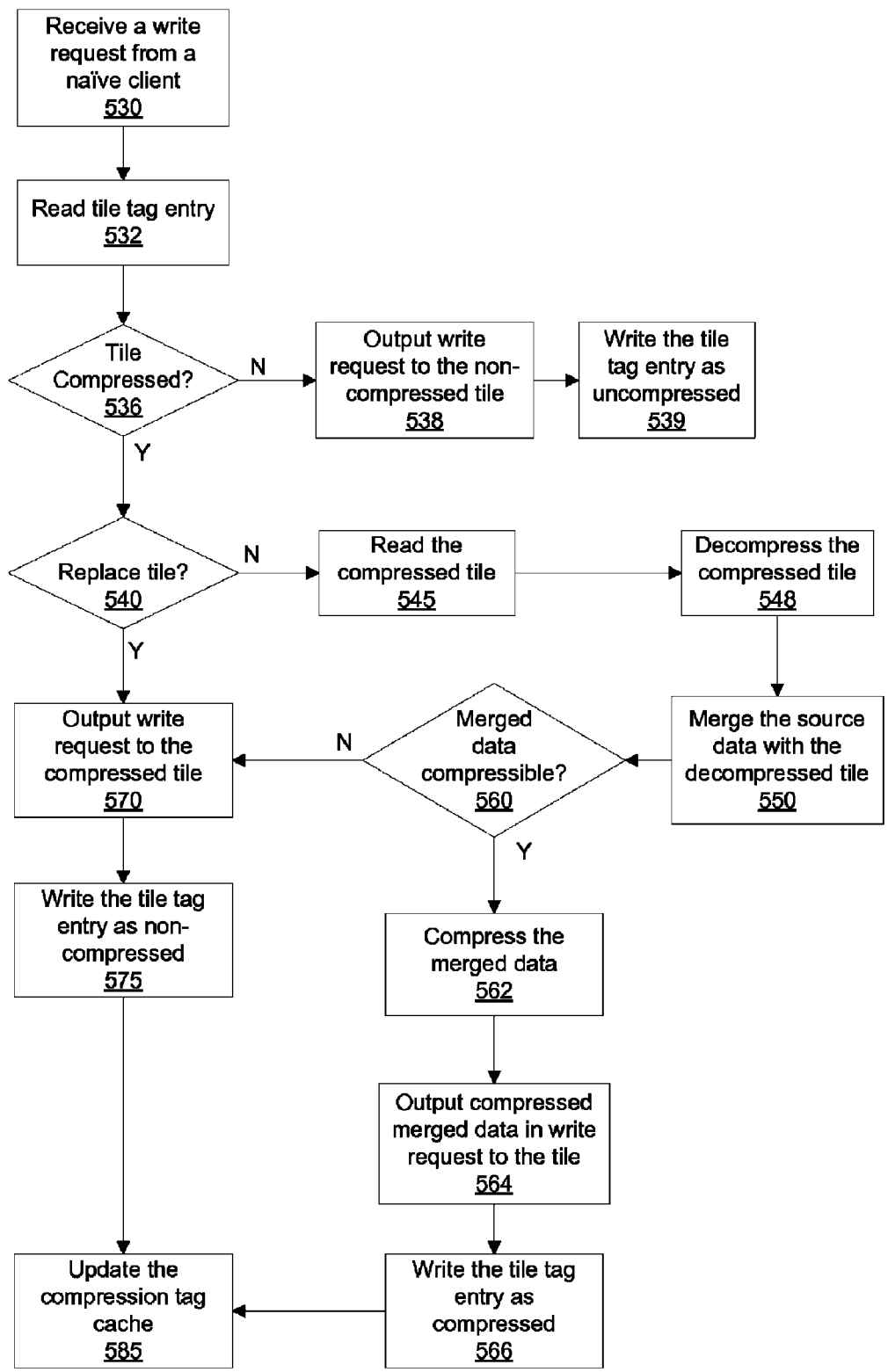
FIG. 5C illustrates a flow diagram of another exemplary method of performing a write request for a naïve client in accordance with one or more aspects of the present invention.

FIG. 5C illustrates a flow diagram of another exemplary method of performing a write request for naïve client 365, in accordance with one or more aspects of the present invention. Steps 530, 532, 536, 538, 539, 540, 545, 548, and 550 are completed as previously described in conjunction with FIG. 5B. In step 560 RMW unit 322 determines if the merged tile data is compressible, and, if so in step 562 RMW unit 322 compresses the merged tile data to produce compressed merged tile data. In step 564 RMW unit 322 outputs the write request including the compressed merged data for the tile to the compressed tile. In step 566 RMW unit 322 outputs an update for arbitration unit 325 to write the compression tag state stored in compression tag storage 330 for the tile as compressed. Once the compression tag state is written in compression tag storage 330, the corresponding tag state in compression tag cache 358 is updated in step 585. If, in step 560 RMW unit 322 determines that the merged tile data is not compressible, then steps 570, 575, and 585 are completed as previously described in conjunction with FIG. 5B.

Figure 6:
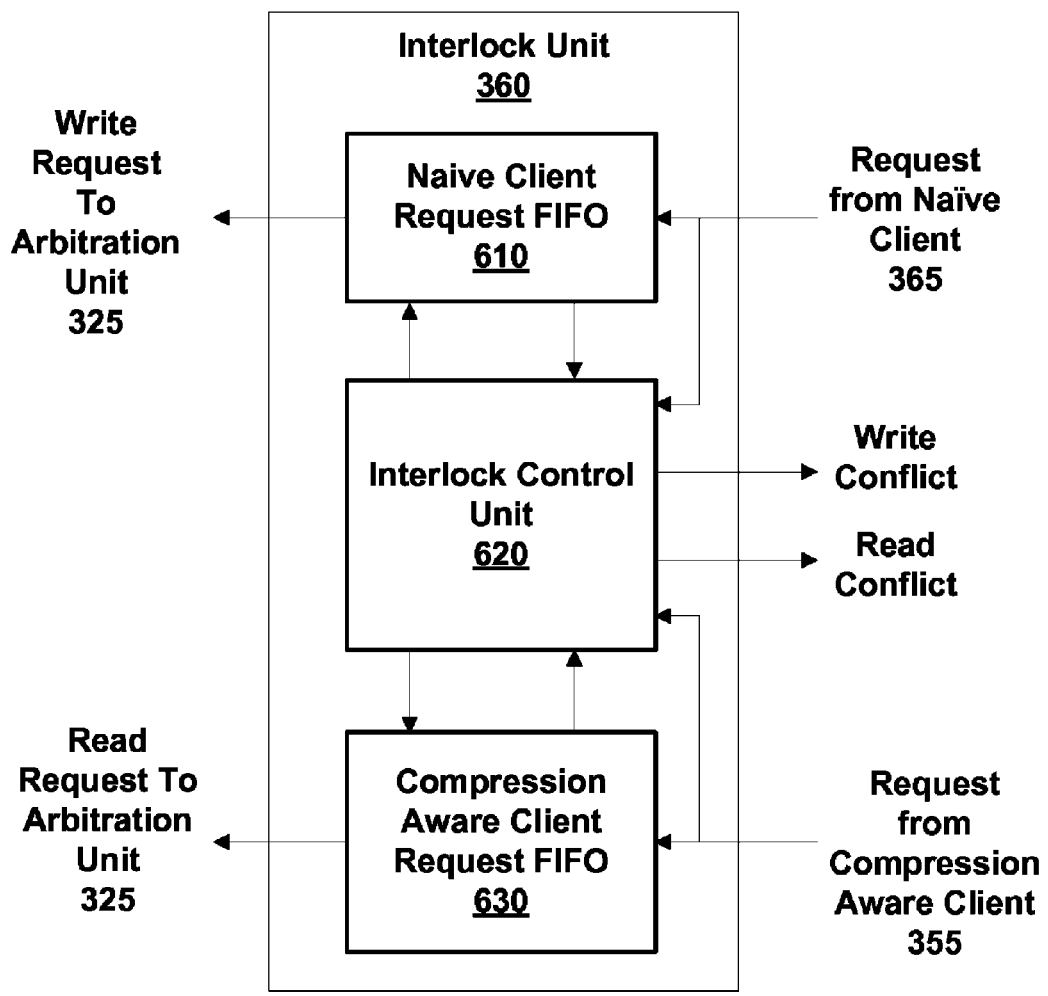
FIG. 6 is a block diagram of the interlock unit of FIG. 3 in accordance with one or more aspects of the present invention.

FIG. 6 is a block diagram of interlock unit 360 of FIG. 3, in accordance with one or more aspects of the present invention. Interlock unit 360 holds off write requests from naïve client 365 and read requests from compression aware client 355 as needed when requests that may change the compression tag for a particular tile are queued for input to arbitration unit 325. A problem can occur when compression aware client 355 outputs a read request for a compressed tile and naïve client 365 outputs a write to the same tile, causing the memory controller to change the compression tag for the tile to non-compressed and write uncompressed data to the tile. If the write request is processed before the read request, the amount of space allocated in returned data buffer 336 may be too small to store the non-compressed data that will be returned. Alternatively, the amount of the non-compressed data can be returned that equals the amount of space allocated in returned data buffer 336 for compressed tile data. In either case, only a portion of the non-compressed read tile data that does not correctly represent the non-compressed tile data that was requested will be provided to compression aware client 355 instead of the entire tile.

Interlock unit 360 includes a request FIFO for each naïve client 365 and each compression aware client 355 within graphics processing pipeline 150. Naïve client request FIFO 610 receives read and write requests from naïve client 365 and compression aware client request FIFO 630 receives read and write requests from compression aware client 355. Naïve client request FIFO 610 outputs read and write requests from naïve client 365 to arbitration unit 325. Similarly, compression aware client request FIFO 630 outputs read and write requests from compression aware client 355 to arbitration unit 325. An interlock control unit 620 monitors incoming requests, the requests pending in naïve client request FIFO 610, and the requests pending in compression aware client request FIFO 630 and controls when the requests accepted from compression aware client 355 and naïve client 365, as described in conjunction with FIGS. 7A and 7B.

Figure 7A:
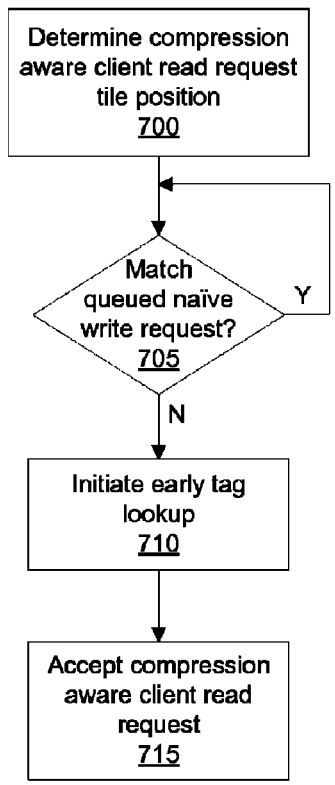
FIG. 7A illustrates a flow diagram of an exemplary method of interlocking a read request for a compression aware client in accordance with one or more aspects of the present invention.

FIG. 7A illustrates a flow diagram of an exemplary method of interlocking a read request for compression aware client 355, in accordance with one or more aspects of the present invention. In step 700 interlock control unit 620 determines the tile position corresponding to a read request received from compression aware client 355. As previously described, the tile position may be specified using a portion of the x,y coordinates in image space or by using the row and bank portion of a DRAM address for the tile.

In step 705 interlock control unit 620 determines if the tile position for the incoming read request matches the tile position for an incoming write request from naïve client 365 or a pending write request in naïve client request FIFO 610, and, if so, interlock control unit 620 indicates to compression aware client 355 that a read conflict exists. Note that the read request is not stored in compression aware client request FIFO 630 when the incoming read request from compression aware client 355 matches a pending write request or an incoming write request from naive client 365. The combination of pending write requests and the incoming write request from naïve client 365 are referred to as queued write requests. Likewise, the combination of pending read request and the incoming read request from compression aware client 355 are referred to as queued read requests.

If, in step 705 interlock control unit 620 determines that a read conflict does not exist or that a read conflict no longer exists, then in step 710 compression aware client 355 initiates an early compression tag lookup for the tile by reading the corresponding tile entry from compression tag cache 358. The read request is considered to be queued by interlock control unit 620 while compression aware client 355 completes the early compression tag lookup for the read request. Therefore, conflicting incoming write requests from naïve client 365 are not accepted by interlock control unit 620 while compression aware client 355 completes the early compression tag lookup for the read request. In step 715 interlock control unit 620 accepts the read request presented by compression aware client 355.

In embodiments of the present invention that include a single compression aware client 355 and one or more naïve clients 365, compression aware client 355 may be configured to perform a compression tag lookup when interlock control unit 620 determines that a read conflict exists. If the compression tag indicates that the compression state is uncompressed, the read request may proceed regardless of whether or not the conflict exists. This is possible since naïve client 365 can only change the compression state for a tile from compressed to uncompressed. therefore, a conflicting naïve client access will not change the compression state of the tile from uncompressed to compressed.

Figure 7B:
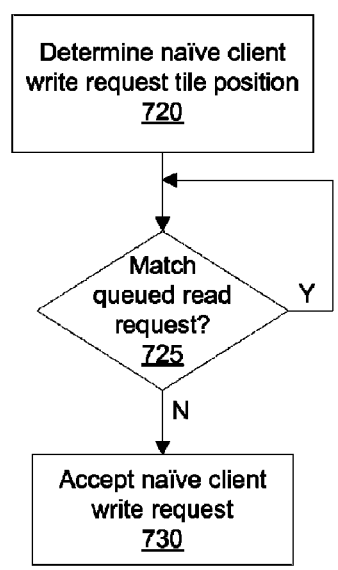
FIG. 7B illustrates a flow diagram of an exemplary method of interlocking a write request for a naïve client in accordance with one or more aspects of the present invention.

FIG. 7B illustrates a flow diagram of an exemplary method of interlocking a write request for naïve client 365, in accordance with one or more aspects of the present invention. In step 720 interlock control unit 620 determines the tile position corresponding to a read request received from naïve client 365. In step 725 interlock control unit 620 determines if the tile position for the incoming write request matches the tile position for a queued read request from compression aware client 355, and, if so, interlock control unit 620 indicates to naïve client 365 that a write conflict exists. Naïve client 365 holds the write request rather than presenting a new request to interlock control unit 620 until the write request is accepted by interlock control unit 620. If, in step 725 interlock control unit 620 determines that a write conflict does not exist or that a write conflict no longer exists, then in step 730 interlock control unit 620 accepts the write request presented by naïve client 365.

Figure 8A:
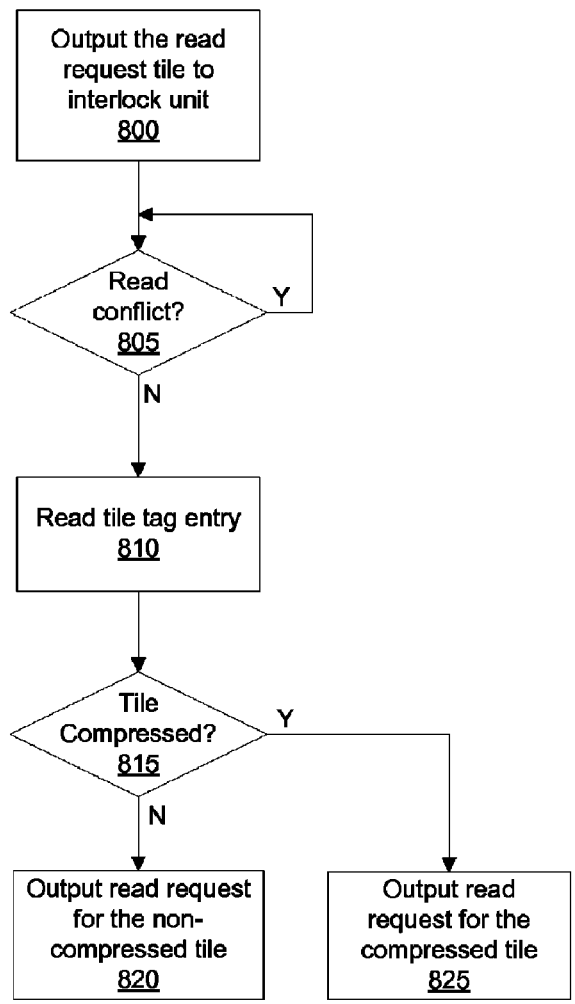
FIG. 8A illustrates a flow diagram of another exemplary method of performing a read request for a compression aware client in accordance with one or more aspects of the present invention.

FIG. 8A illustrates a flow diagram of an exemplary method of performing an early compression tag read for a read request produced by compression aware client 355, in accordance with one or more aspects of the present invention. In step 800 compression aware client 355 outputs a read request tile position to interlock unit 360 to determine if there is an existing read conflict for the tile. Because the compression tag lookup has not been completed, the read request does not necessarily include the read size.

In step 805 compression aware client 355 determines if a read conflict exists for the tile based on a read conflict signal produced by interlock control unit 620 in response to the read request tile. If, in step 805 compression aware client 355 determines that a read conflict does exist, then compression aware client 355 waits until the read conflict no longer exists before proceeding to step 810.

In step 810 compression aware client 355 reads the compression tag entry from compression tag cache 358 that corresponds to the tile to be read. In step 815 compression aware client 355 determines if the compression tag for the tile indicates that the tile is compressed, and, if so, in step 825 compression aware client 355 outputs the read request for the compressed tile specifying that the compressed tile entries should be read rather than the entire tile. If, in step 815 compression aware client 355 determines that the compression tag for the tile indicates that the tile is non-compressed, then in step 820 compression aware client 355 outputs the read request for the non-compressed tile specifying the tile entries that should be read.

Figure 8B:
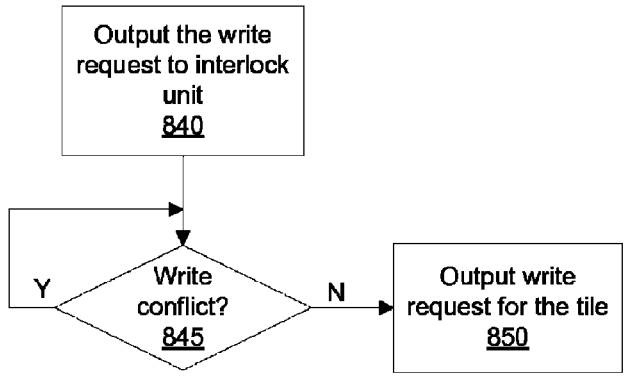
FIG. 8B illustrates a flow diagram of an exemplary method of performing a write request for a naïve client in accordance with one or more aspects of the present invention.

FIG. 8B illustrates a flow diagram of an exemplary method of performing write request produced by naïve client 365, in accordance with one or more aspects of the present invention. In step 840 naïve client 365 outputs a write request, including a tile position to interlock unit 360 to determine if there is an existing write conflict for the tile. In step 845 naïve client 365 determines if a write conflict exists for the tile based on a write conflict signal produced by interlock control unit 620 in response to the write request. If, in step 845 naïve client 365 determines that a write conflict does exist, then naïve client 365 waits until the write conflict no longer exists before proceeding to step 850. In step 850 naïve client 365 outputs the write request for the tile and proceeds to produce another request.

Persons skilled in the art will appreciate that any system configured to perform the method steps of FIGS. 4A, 4B, 4C, 4D, 5A, 5B, 5C, 7A, 7B, 8A, and 8B or their equivalents, is within the scope of the present invention. Systems and methods for determining a compression tag state prior to memory client arbitration allow for memory bandwidth optimizations including reordering memory access requests for efficient access while allowing a surface to include a combination of compressed and non-compressed tiles. A client uses the compression tags to construct memory access requests and the size of each request is based on whether or not the portion of the surface to be accessed is compressed or not. Accesses to non-compressed portions require transferring a greater amount of data than accesses to compressed portions and space in a return data buffer is allocated based on a client read request. When multiple clients access the same surface the compression tag reads are interlocked with the pending memory access requests to ensure that the compression tags provided to each client are accurate. Data corruption is avoided by interlocking naïve client write requests and compression aware client read requests. Memory access requests may be reordered to reduce DRAM row-bank activation and precharge cycles and unnecessary conditional reads may be avoided to further improve memory bandwidth utilization. Compression tags may be cached within compression aware clients to avoid wasting memory bandwidth to query the compression state of tiles.

While the foregoing is directed to embodiments of the present invention, other and further embodiments of the invention may be devised without departing from the basic scope thereof, and the scope thereof is determined by the claims that follow. The foregoing description and drawings are, accordingly, to be regarded in an illustrative rather than a restrictive sense. The listing of steps in method claims do not imply performing the steps in any particular order, unless explicitly stated in the claim.

All trademarks are the respective property of their owners.

The invention claimed is:

1. A method of reading a surface stored in memory that includes compressed data and non-compressed data, comprising:

producing a read request from a compression aware client to obtain existing data stored in a tile mapped to the surface;

reading a compression tag corresponding to a position of the tile from a compression tag cache;

determining if the existing data stored in the tile is represented in a compressed format or in a non-compressed format based on the compression tag;

allocating an amount of memory in a returned data buffer to buffer the existing data stored in the tile based on the compression tag, wherein entries in the returned data buffer are allocated in the order in which read requests are received from the compression aware client;

outputting the read request for arbitration to access the memory in order to receive the existing data stored in the tile;

arbitrating the read request with other read and write requests, including other read and write requests produced by a naive client that is only able to read and write non-compressed surfaces, to produce arbitrated read requests and arbitrated write requests;

reordering the arbitrated read requests and the arbitrated write requests based on sizes of the arbitrated read requests indicated by the compression tag to produce reordered requests that are in a different order than the order in which the requests are received from the compression aware client; and updating the compression tag stored in the compression tag cache when an entry in a compression tag storage corresponding to the position of the tile is changed.

2. The method of claim 1, further comprising receiving a write request including non-compressed data for storage in the tile, wherein the updating of the compression tag changes the entry from a compressed state to a non-compressed state when the existing data is represented in a compressed format.

3. The method of claim 2, wherein the non-compressed data represents a portion of the tile.

4. The method of claim 2, wherein the non-compressed data represents the entire tile.

5. The method of claim 1, wherein the read request includes a mask indicating that a compression tile portion of the tile should be read when the tile is represented in a compressed format.

6. The method of claim 1, further comprising determining a size of the read request based on a compression ratio specified by the compression tag when the existing data is represented in the compressed format.

7. The method of claim 1, wherein the position is specified by a row and bank portion of a DRAM (dynamic random access memory) address for the tile.

8. The method of claim 1, wherein the reordered requests are in a different order than the arbitrated read and write requests.

9. A method of writing a surface stored in memory that includes compressed data and non-compressed data, comprising:

producing a write request by a compression aware client to store new data in a tile mapped to the surface;

reading a compression tag corresponding to a position of the tile from a compression tag cache;

determining that existing data stored in the tile is represented in a compressed format;

outputting the write request for arbitration to access the memory in order to store the new data in the tile;

arbitrating the write request with other read and write requests, including other read and write requests produced by a naive client that is only able to read and write non-compressed surfaces, to produce arbitrated read and write requests; and reordering the arbitrated read and write requests, based on a size of the write request that is indicated by an updated compression tag for the new data to produce reordered requests that are in a different order than the order in which requests are received from the compression aware client.

10. The method of claim 9, further comprising updating an entry in a compression tag storage corresponding to the position of the tile from compressed to non-compressed when the new data is not compressible.

11. The method of claim 10, further comprising updating the compression tag stored in the compression tag cache as non-compressed to match the entry in the compression tag storage.

12. The method of claim 9, further comprising reading the existing data stored in the tile when the write request specifies writing only a portion of the tile and when the existing data stored in the tile is represented in a compressed format.

13. The method of claim 12, further comprising:
decompressing the existing data to be represented in the non-compressed format to produce decompressed data; and
merging the decompressed data with the new data before determining if the new data is compressible.

14. The method of claim 12, further comprising allocating an amount of memory in a returned data buffer to buffer the existing data stored in the tile based on the compression tag, wherein entries in the returned data buffer are allocated in the order in which requests are received from the compression aware client.

15. The method of claim 9, wherein the reordered requests are in a different order than the arbitrated read and write requests.

16. A system for accessing a surface stored in memory that includes data represented in a compressed format and data represented in a non-compressed format, comprising:

a compression aware client configured to produce the data represented in the compressed format or the data represented in the non-compressed format for storage in tiles mapped to the surface and to produce read and write requests to access the surface;

an arbitration unit configured to arbitrate between the read and write requests produced by the compression aware client and read and write requests produced by a naive client that is only able to read and write non-compressed surfaces to produce arbitrated read and write requests;

a compression tag storage coupled to the arbitration unit and configured to store a compression tag indicating whether each one of the tiles mapped to the surface stores the data represented in the compressed format or the data represented in the non-compressed format;

a request unit that is coupled between the arbitration unit and the memory and configured to reorder the arbitrated read and write requests produced by the compression aware client based on the compression tags to produce reordered requests that are in a different order than the order in which the requests are received from the compression aware client;

a returned data buffer coupled between the arbitration unit and the memory and configured to buffer the data stored in the tiles in an amount of memory that is allocated by the arbitration unit based on the compression tag for each one of the tiles, wherein entries in the returned data buffer are allocated in the order in which read requests are received from the compression aware client; and a compression tag cache coupled between the compression aware client and the compression tag storage and configured to process compression tag writes received from the arbitration unit and process compression tag reads received from the compression aware client.

17. The system of claim 16, wherein the compression tag specifies a particular compression format when the data is represented in the compressed format.

18. The system of claim 16, wherein the compression aware client is further configured to determine whether or not data is compressible and produce the data represented in the compressed format when the data is compressible.

19. The system of claim 16, wherein the read requests include a mask indicating that a compression tile portion of a tile should be read when the tile is represented in the compressed format.

20. The system of claim 16, wherein the reordered requests are in a different order than the arbitrated read and write requests.

* * * * *